(12) United States Patent
Pesavento et al.

(10) Patent No.: US 8,416,630 B2
(45) Date of Patent: *Apr. 9, 2013

(54) PFET NONVOLATILE MEMORY

(75) Inventors: Alberto Pesavento, Seattle, WA (US); John D. Hyde, Corvalis, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/342,834

(22) Filed: Jan. 3, 2012

(65) Prior Publication Data

US 2012/0099380 A1    Apr. 26, 2012

Related U.S. Application Data

(63) Continuation of application No. 11/865,777, filed on Oct. 2, 2007, now Pat. No. 8,111,558, which is a continuation-in-part of application No. 11/237,099, filed on Sep. 28, 2005, now Pat. No. 7,283,390, which is a continuation-in-part of application No. 10/839,985, filed on May 5, 2004, now Pat. No. 7,221,596.

(51) Int. Cl.
*G11C 11/34* (2006.01)

(52) U.S. Cl.
USPC ............. 365/185.28; 365/185.18; 365/189.07

(58) Field of Classification Search ............. 365/185.28, 365/185.18, 185.21, 185.14, 232, 207, 189.09, 365/189.07, 185.26, 104, 149, 185.24
See application file for complete search history.

(56) References Cited

U.S. PATENT DOCUMENTS 7,221,596 B2 *  5/2007  Pesavento et al. ....... 365/185.21
8,111,558 B2 *  2/2012  Pesavento et al. ....... 365/185.28

* cited by examiner

*Primary Examiner* — Dang Nguyen
(74) *Attorney, Agent, or Firm* — Fenwick & West LLP

(57) ABSTRACT

A nonvolatile memory cell is constructed using a floating-gate pFET readout transistor having its source tied to a power source (Vdd) and its drain providing a current, which can be sensed to determine the state of the cell. The gate of the pFET readout transistor provides for charge storage, which can be used to represent information such as binary bits. A control capacitor coupled between a first voltage source and the floating gate and a tunneling capacitor between a second voltage source and the floating gate are fabricated so that the control capacitor has much more capacitance than the tunneling capacitor. Manipulation of the voltages applied to the first voltage source and second voltage source controls an electric field across the capacitor structure and pFET dielectrics and thus Fowler-Nordheim tunneling of electrons on and off the floating gate, controlling the charge on the floating gate and the information stored thereon.

27 Claims, 16 Drawing Sheets

Hysteresis by Addition

Hysteresis by Subtraction

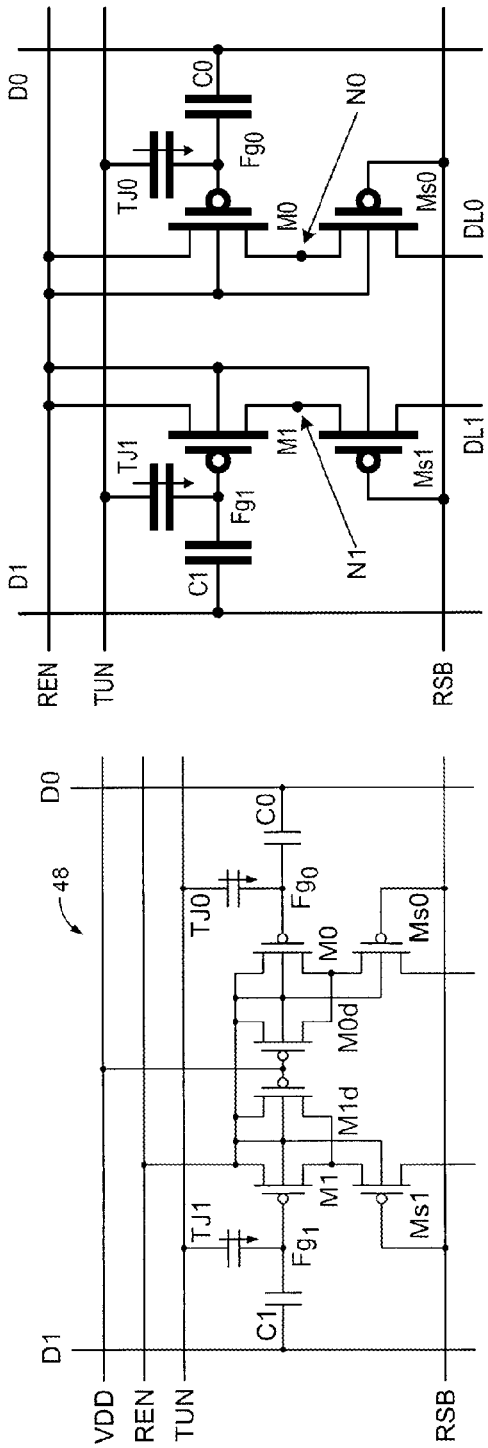
FIG. 13A (PRIOR ART)
FIG. 13B
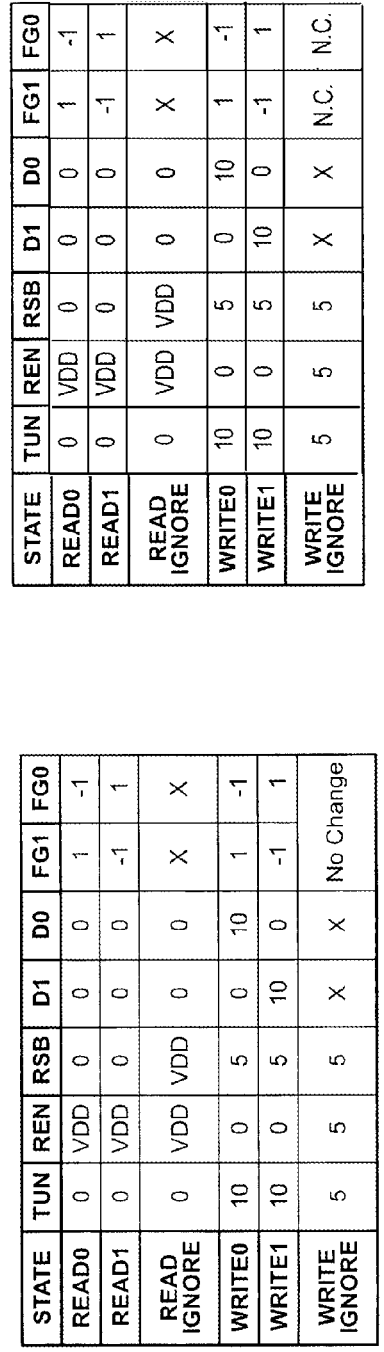
FIG. 14A (PRIOR ART)
FIG. 14B

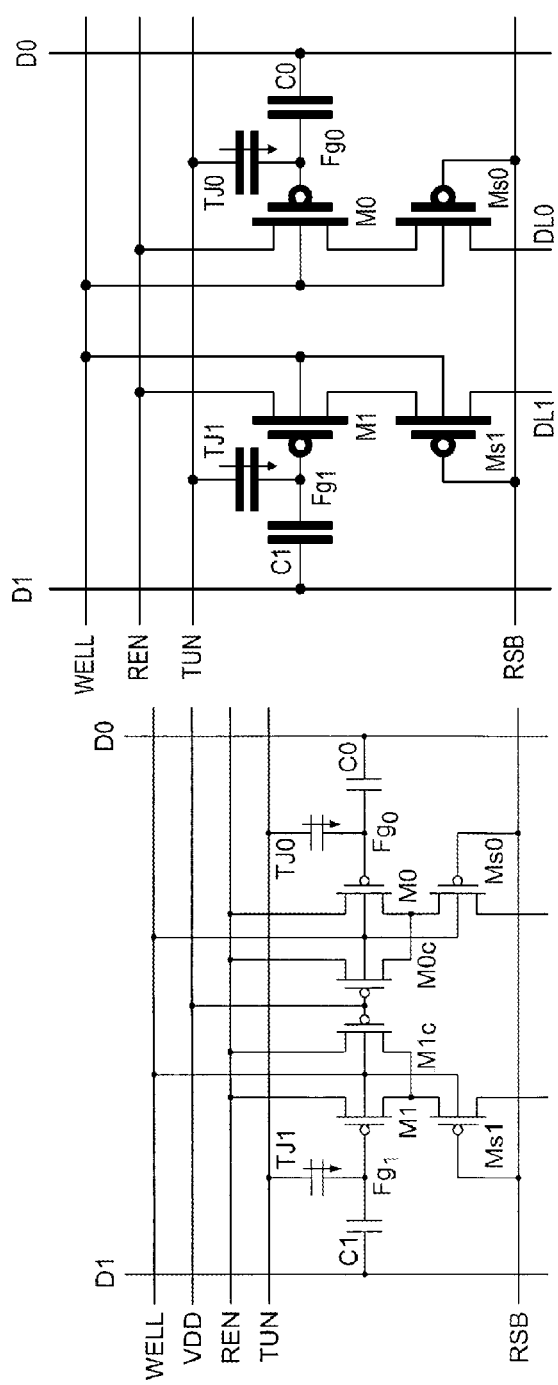

PFET NONVOLATILE MEMORY

RELATED APPLICATIONS

This application is Continuation of U.S. patent application Ser. No. 11/865,777, filed on Oct. 2, 2007, entitled "PFET Nonvolatile Memory," which is a Continuation-In-Part (CIP) of U.S. application Ser. No. 11/237,099, filed on Sep. 28, 2005, now issued as U.S. Pat. No. 7,283,390, which is a CIP of U.S. application Ser. No. 10/839,985, filed on May 5, 2004, now issued as U.S. Pat. No. 7,221,596.

TECHNICAL FIELD

The present invention relates generally to nonvolatile memory. More particularly, the present invention relates to single-ended and differential-type nonvolatile memory using floating-gate p-channel field effect transistors (pFETs) to store information as electric charge.

BACKGROUND

Nonvolatile memory (NVM) is an important form of memory in today's electronic circuits, NYM is used to store serial number information, security information, settings, parameters, computer instructions (firmware), and the like. Reprogrammable NVM is particularly important in the field of tags, such as RFID (radio frequency identification) tags, which store information inexpensively and can be remotely sensed without the need to complete an actual circuit with the RFID tag itself. Such tags lack their own power supply and are powered instead by current rectified from a scanner's read-carrier RF signal received from an REID reader/scanner.

SUMMARY

A nonvolatile memory cell is constructed using a floating-gate pFET readout transistor having its source tied to a power source (Vdd), its drain providing the current, which can be sensed to determine the state of the cell. The gate of the pFET readout transistor provides for charge storage, which can be used to represent information such as binary bits. A control capacitor structure having its first terminal coupled to the first voltage source and its second terminal coupled to the floating gate and a tunneling capacitor structure having its first terminal coupled to the second voltage source and its second terminal coupled to the floating gate are utilized in each embodiment. The control capacitor structure may be fabricated so that it has much more capacitance than does the tunneling capacitor structure and assorted stray capacitance between the floating gate and various other nodes of the cell). Manipulation of the voltages applied to the first voltage source and second voltage source (and Vdd) control an electric field across the capacitor structure and pFET dielectrics, thus Fowler-Nordheim tunneling of electrons onto and off of the floating gate, thus controlling the charge on the floating gate and the information value stored thereon. Both single-ended and differential memory cells are implemented. Hysteresis circuits may also be provided to supply additional write margin. Arrays of such nonvolatile memory cells are also implemented.

Other aspects of the inventions are described and claimed below, and a further understanding of the nature and advantages of the inventions may be realized by reference to the remaining portions of the specification and the attached drawings.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 13A is an electrical schematic diagram of an NVM cell, for use in an array of NVM cells, in accordance with a PRIOR ART embodiment.

FIG. 13B is an electrical schematic diagram of an NVM cell, use its an array of NVM cells, in accordance with an embodiment of the present invention.

FIG. 14A is a table, illustrating a set of applied voltages and operating states for the NVM cell of FIG. 13A.

FIG. 14B is a table, illustrating a set of applied voltages and operating states for the NVM cell of FIG. 13B.

FIG. 17 is an electrical schematic diagram of an NVM cell, for use in an array of cells, in accordance with another embodiment of the present invention.

FIG. 18 is a table illustrating a set of applied voltages and operating states for the NVM cell of FIG. 17.

DETAILED DESCRIPTION

Figure 1A:
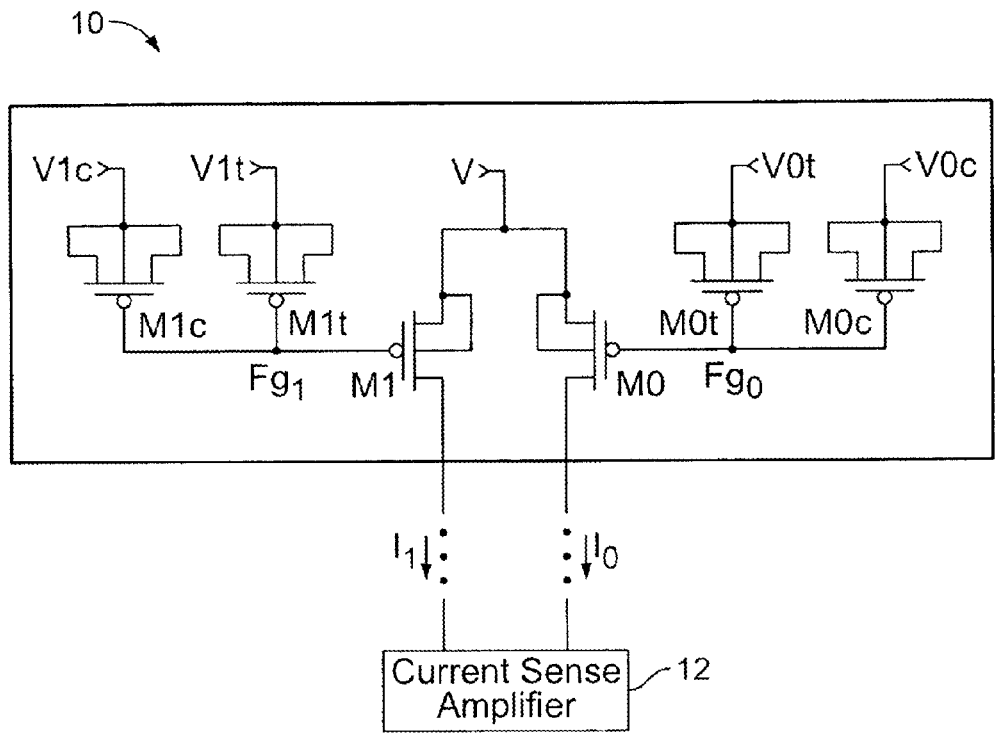
FIG. 1A is an electrical schematic diagram illustrating an embodiment of a basic differential pFET NVM memory cell 10, in accordance with an embodiment of the present invention.

Embodiments of the present invention described in the following detailed description are directed at floating-gate nonvolatile memory cells having pFET readout transistors. Those of having ordinary skill in the art will realize that the detailed description is illustrative only and is not intended to restrict the scope of the claimed inventions in any way. Other embodiments of the present invention, beyond those embodiments described in the detailed description, will readily suggest themselves to those of ordinary skill in the art having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as, compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, the symbol n+ indicates an n-doped semiconductor material typically having a doping level of n-type dopants on the order of $10^{21}$ atoms per cubic centimeter. The symbol n− indicates an n-doped semiconductor material typically having a doping level on the order of $10^{17}$ atoms per cubic centimeter. The symbol p+ indicates a p-doped semiconductor material typically having a doping level of p-type dopants on the order of $10^{21}$ atoms per cubic centimeter. The symbol p− indicates a p-doped semiconductor material typically having a doping level on the order of $10^{17}$ atoms per cubic centimeter for p− wells and a doping level on the order of $10^{15}$ atoms per cubic centimeter for p− substrate material. Those of ordinary skill in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates, as known to those of ordinary skill in the art. Such persons of ordinary skill in the art will now also realize that a range of doping concentrations around those described above will also work. Essentially, any process capable of forming pFETs and nFETs will work. Doped regions may be diffusions or they may be implanted.

A number of circuits, that may be used as NVM cells and arrays for such cells, are described in detail below. These NVM circuits are able to store information by modifying a charge (i.e., by adding or removing electrons) stored on a floating gate of one or more pFET transistors. In digital implementations of the invention, the state (i.e., either a "1" or a "0") of the memory cell is read by measuring the current of some of the pFETs in the circuit. The use of pFETs instead of nFETs (n-channel FETs) offers better data retention, higher endurance, and requires no additional processing steps beyond what is available in standard logic CMOS processes.

Obviously, if desired, these circuits can be fabricated in as complicated a process as desired; however, they are all capable of being fabricated in single-poly (single layer of polysilicon) logic CMOS processes, as supported by virtually all semiconductor foundries operating today. Conventional FLASH and EEPROM NVM require special process steps beyond those of logic CMOS and are, consequently, more difficult and more expensive to fabricate. Applications that require up to several kilobytes of NVM on the same chip with other circuitry and/or require low cost fabrication are ideal candidates for the circuits discussed herein.

Turning now to FIG. 1A, a basic differential pFET NVM memory cell 10 is illustrated. This cell has two floating gates denoted $Fg_0$ and $Fg_1$. By storing a different amount of electrons on the two floating gates, it is possible to establish a voltage differential between the two floating gates. When the NVM cell is powered, through the terminal denoted "V", a difference in the readout currents $I_0$ and $I_1$ is present and a sense amplifier such as a conventional current sense amplifier 12 can consequently be used to discern the logic value stored in the cell. For example, the condition $I_0 > I_1$ may be used to signify the logic value "0" and the condition $I_0 < I_1$ may be used to signify the logic value "1".

As shown in FIG. 1A, transistors M1, M1$t$ and M1$c$ have floating gate $Fg_1$ in common. Transistors M0, M0$t$ and M0$c$ have floating gate $Fg_0$ in common. V1$c$ is the voltage terminal for transistor M1$c$; V1$t$ is the voltage terminal for transistor M1$t$; V is the voltage terminal for transistors M1 and M0; V0$t$ is the voltage terminal for transistor M0$t$; and V0$c$ is the voltage terminal for transistor M0$c$. As can be seen M1$c$, M1$t$, M0$t$, and M0$c$, in accordance with this illustrated embodiment, may all be shorted pFETs in that their source, drain and well connections are all tied together as shown. The voltage terminals referred to above are therefore connected to the respective source, drain and well of the shorted pFETs. M1$c$, M1$t$, M0$t$, and M0$c$ may also be constructed as other types of transistors, such as nFETs. M1$e$ and M0$c$, which are used as control capacitors, may also be constructed as poly-poly, or poly-metal capacitors. Metal-metal capacitors can also be used for the control capacitor structures, although with existing fabrication processes this would reduce the memory retention time due to leakage from the poly contact and the metal inter-layer dielectric. By applying the appropriate voltages to terminals V01, V0$t$, V1$c$, V1$t$ and V, a sufficiently large electric field can be established across the oxide dielectric of any of the three pFETs connected to each floating gate $Fg_0$, $Fg_1$, so that the well-known mechanism of Fowler-Nordheim (FN) tunneling may be used to pass electrons through the oxide dielectric of the selected transistor.

Figure 1B:
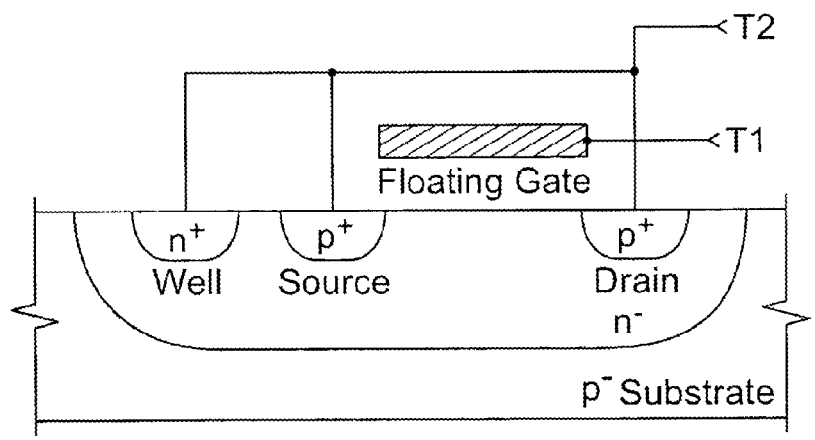
FIG. 1B is a side elevational diagram of a well-source-drain shorted pFET as used in some embodiments of the present invention for the control capacitor structure and the tunneling transistor structure.
Figure 1C:
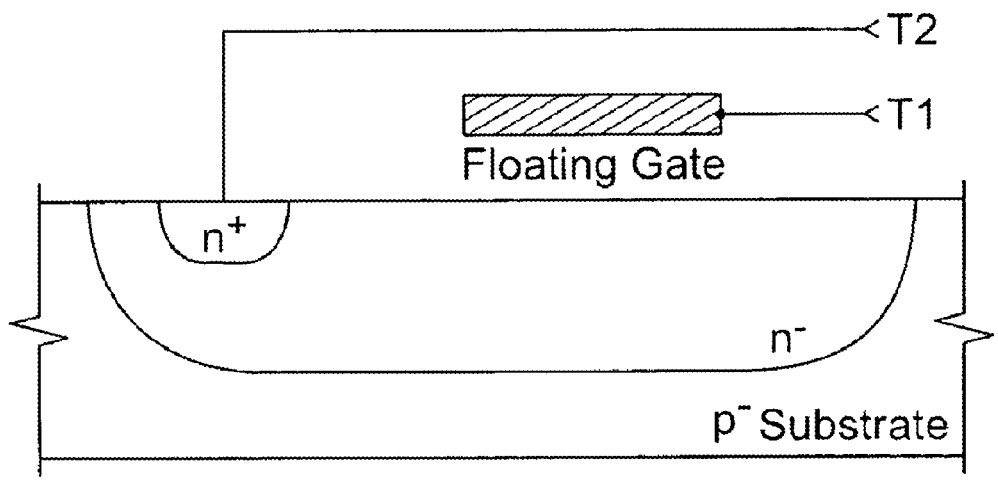
FIG. 1C is a side elevational diagram of a simplified capacitor structure as used in some embodiments of the present invention for the control capacitor structure.

In order to establish a large electric field across one of the pFETs' oxides, the gate area of one of the two corresponding shorted pFETs (e.g., M1$c$ and M1$t$ shown on he left side in FIG. 1A) should be made sufficiently large so that it acts as a control capacitor for the floating gate itself. FIG. 1B is a side elevational diagram of a well-source-drain shorted pFET as used in some embodiments of the present invention for the control capacitor structure and the tunneling transistor structure. Terminals T1 and T2 are the capacitor terminals. FIG. 1C is a side elevational diagram of a simplified capacitor structure as used in some embodiments of the present invention for the control capacitor structure. Terminals T1 and T2 are the capacitor terminals although the device of FIG. 1C is not, strictly speaking, a transistor, Those of ordinary skill in the art will now realize that various other structures may be used to achieve the same purposes.

Figure 2:
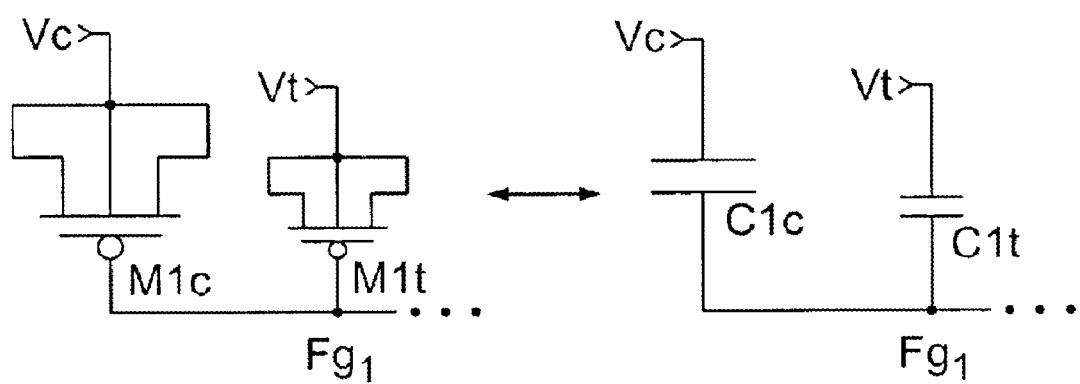
FIG. 2 is a partial electrical schematic diagram, illustrating on the left, a portion of the schematic of FIG. 1A with the control transistor (also referred to herein as a control capacitor or control capacitor structure) M1c, shown enlarged relative to tunneling transistor (also referred to herein as a tunneling transistor or tunneling transistor structure) M1t. On the right of the schematic diagram symbol for a capacitor C1c takes the place of transistor M1c and the schematic diagram symbol for a capacitor C1t takes the place of transistor M1t.

Turning now to FIG. 2, on the left is a portion of the schematic of FIG. 1A with the transistor M1$c$ shown enlarged relative to transistor M1$t$; on the right capacitor C1$c$ takes the place of transistor M1$c$ and capacitor C1$t$ takes the place of transistor M1$t$. Where the physical size of transistor M1$c$ is much larger than that of transistor M1$t$ then M1$c$ behaves like a control capacitor for the floating gate Fg1 and can be used to control the floating-gate voltage to establish a large electric field that can be applied to induce bidirectional FN tunneling.

Figure 3:
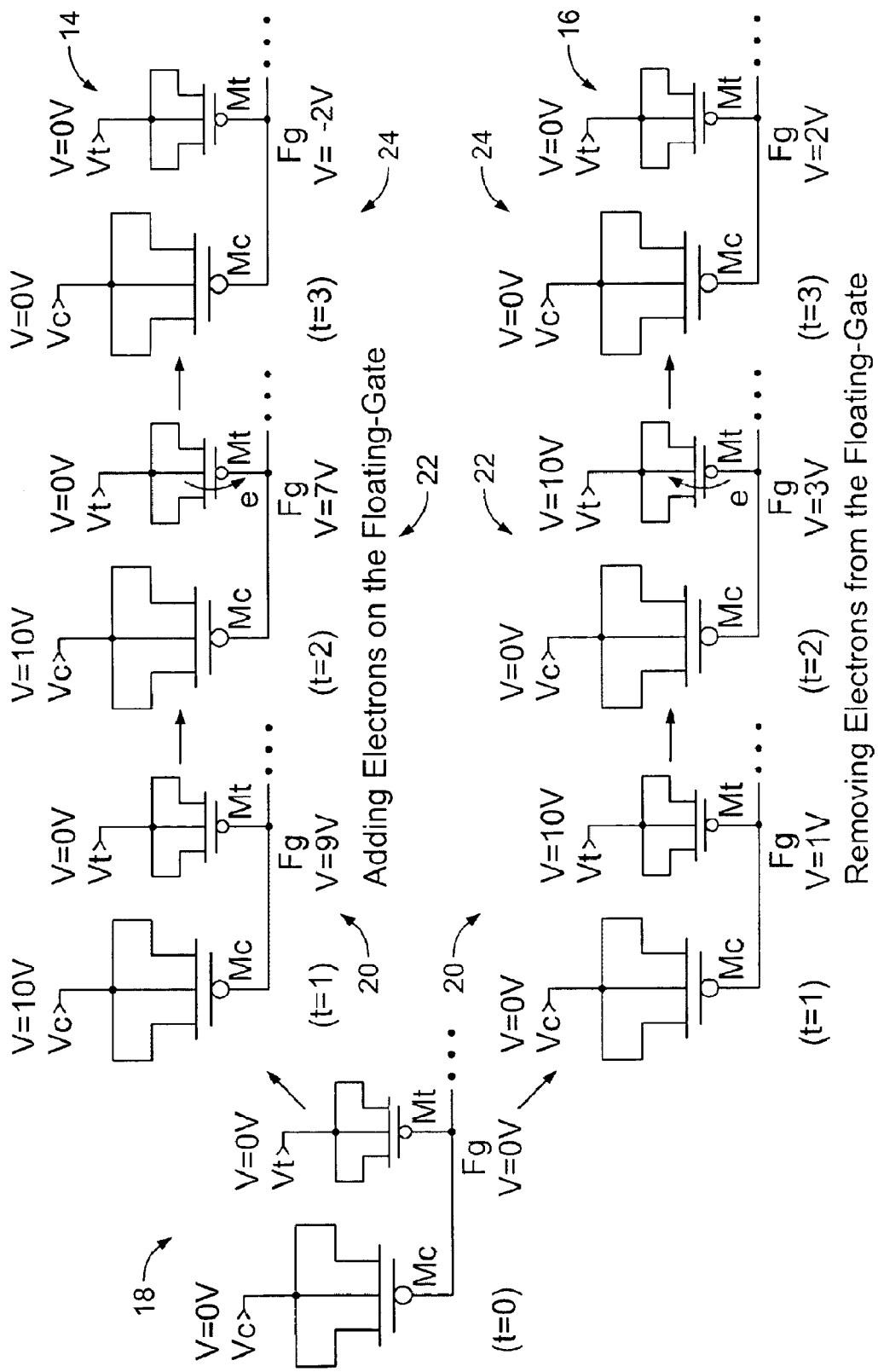
FIG. 3 is a process flow diagram formed of partial electrical schematic diagrams, like those in FIG. 2 which illustrates the process for adding and removing electrons from a floating gate Fg, in accordance with an embodiment of the present invention.

Turning now to FIG. 3, the process for adding and removing electrons from a floating gate Fg is illustrated. The upper branch of the process is denoted 14, and illustrates adding electrons to the floating gate to drop its voltage from 0V to −2V. The lower branch of the process is denoted 16, and illustrates removing electrons from the floating gate to raise its voltage from 0V to +2V.

In more detail, starting from the rest condition 18 with Vc=0V (Vc here is the voltage applied to the source, drain and well terminals of control transistor Mc), Vt=0V (likewise, Vt here is the voltage applied to the source, drain and well terminals of tunneling transistor Mt) and Fg=0V at time t=0, one first establishes the appropriate voltage across the oxide of one of the pFETs by changing the voltage of either Vc or Vt. Due to the skewed capacitive ratio between the two pFETs Mc and Mt, the floating gate is more strongly coupled to the control voltage Vc, creating a large electric field through the oxide of the tunneling pFET Mt at time t=1 (20), Once the electric field is present, electrons start tunneling through the oxide of Mt either adding or removing charge from the floating gate at time t=2 (22). After a certain amount of time the voltage of the floating gate has changed enough to decrease the electric field to the point that the tunneling process is slowed considerably. If the rest biases (Vc=Vt=0V) are then reapplied at time t=3 (24), the net effect of the procedure is that the charge on the floating gate was modified. The voltage values in the example of FIG. 3 are intended to be just an example. The real values will depend upon various factors such as oxide thickness and quality, desired program time, endurance and retention requirements, and the fabrication process used and are well within the skills of those of ordinary skill in the art having the benefit of this disclosure.

Figure 4:
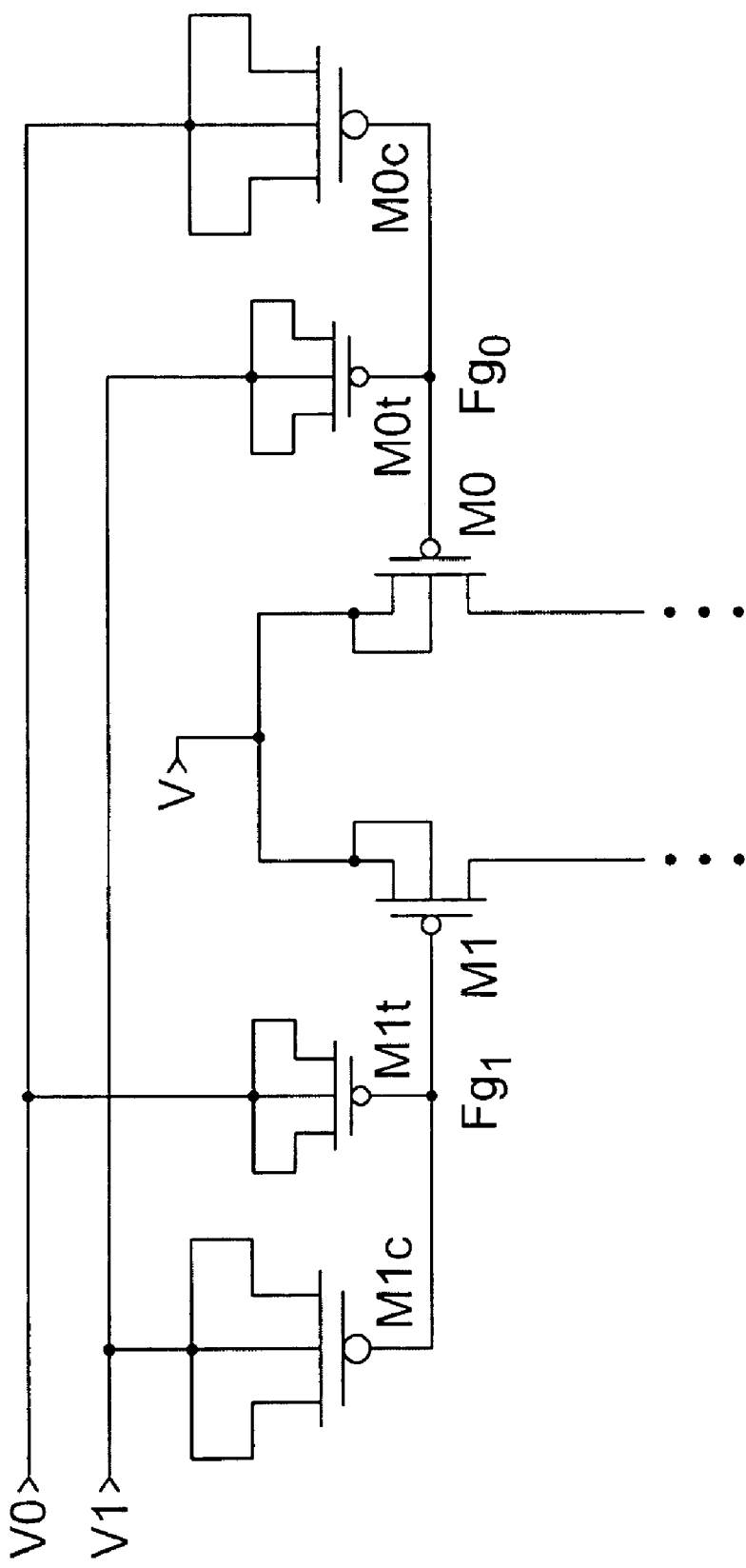
FIG. 4 is an electrical schematic diagram of an NVM cell, in accordance with an embodiment of the present invention, in which the V0 signal is coupled to the tunneling transistor M1t for floating gate $Fg_1$ and to the control transistor M0c for floating gate $Fg_0$, while the V1 signal is coupled to the control transistor M1c for floating gate $Fg_1$ and to the tunneling transistor M0t for floating gate $Fg_0$.

It is now easy to observe that if the opposite biasing voltages are applied to the "0" and "1" sides of the differential NVM cell, electrons can be removed from one floating gate white they are being added to the other. This can be easily accomplished by connecting the NVM cell as illustrated in FIG. 4. In this embodiment, the V0 signal is coupled to the tunneling transistor M1$t$ for floating gate $Fg_1$ and to the control transistor M0$c$ for floating gate $Fg_0$ while the V1 signal is coupled to the control transistor M1$c$ for floating gate $Fg_1$ and to the tunneling transistor M0$t$ for floating gate $Fg_0$.

Figure 5:
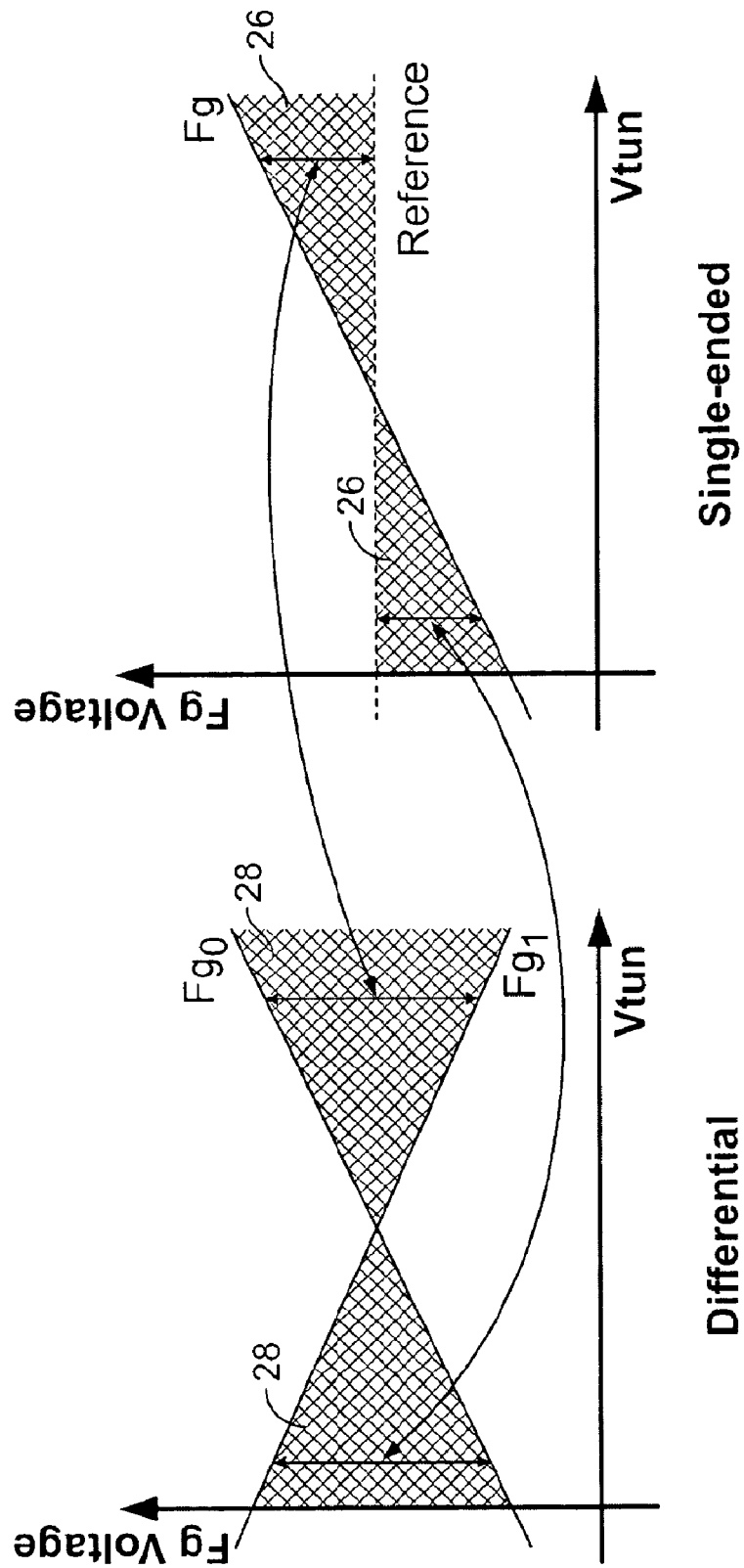
FIG. 5 is a plot of Vtun (tunneling voltage) vs. floating gate voltage for the differential and single-ended cases of NVM cells.

The use of a differential memory cell is advantageous because it allows the doubling of the storage window with respect to a single-ended memory cell. This is illustrated FIG. 5, which shows a plot of Vtun (tunneling voltage) vs. floating gate voltage for the differential and single-ended cases. In a single-ended cell, a reference voltage is generally required and a viable result may be obtained in the sectors shown as shaded and denoted 26. In the double-ended cell, no reference voltage is required and a viable result may be obtained in much larger sectors shown as shaded and denoted 28.

A single-ended approach, on the other hand, has the benefit of reducing by approximately half the number of transistors in the memory cell thus providing an advantage with respect to the differential version in terms of area and cost. The memory cell of FIG. 1A, and the other versions thereof shown and described herein, can be easily implemented as single-ended cells in accordance with the teachings herein with particular reference to FIGS. 6A, 6B and 6C. Differential memory is particularly advantageous in situations where reliable reference voltage sources are not readily available, such as, in portable devices, remotely powered devices (such as RFID tags and security cards), and the like.

Figure 6A:
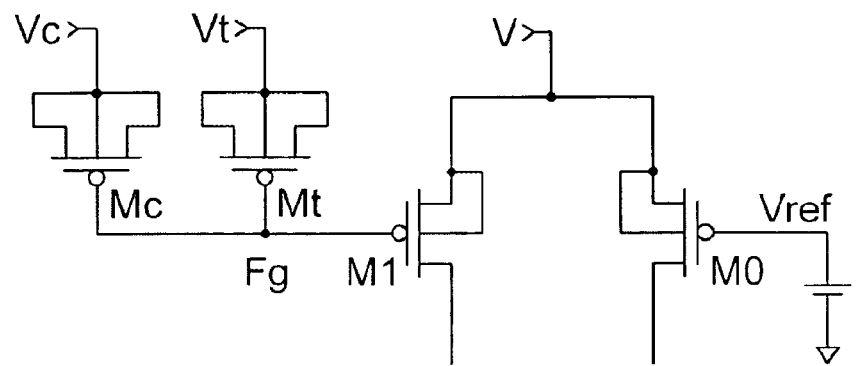
FIGS. 6A, 6B, and 6C illustrate various ways to implement the present invention in a single-ended circuit. In accordance with the circuit of FIG. 6A the second floating gate is coupled to a voltage source to provide a voltage reference for the pFET M0. A practical reference can be ground itself as illustrated in FIG. 6B. The pFET M0 can be omitted altogether, as in FIG. 6C, if a current reference (not shown) is available to the sense amplifier for the current comparison.
Figure 6B:
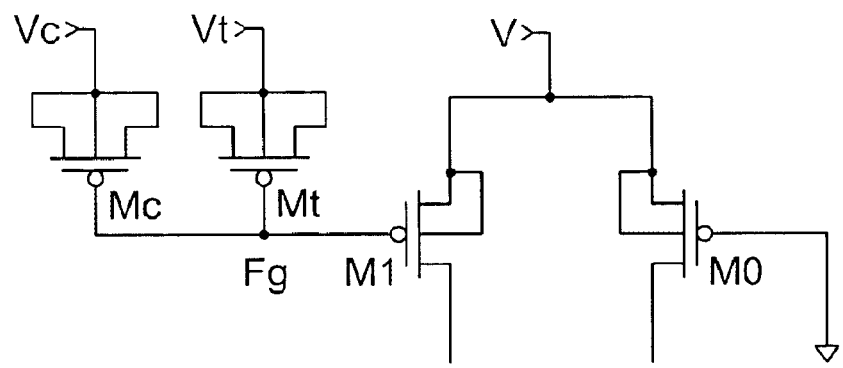
Figure 6C:
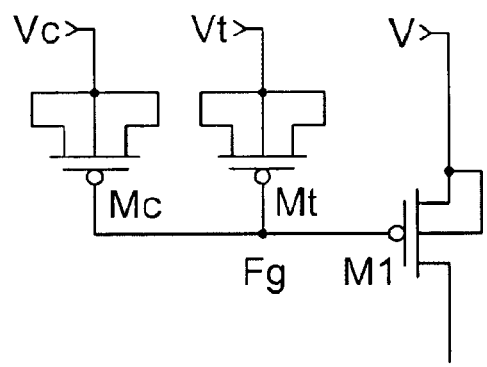

FIGS. 6A, 6B and 6C illustrate various ways to implement the present invention in a single-ended circuit. In accordance with the circuit of FIG. 6A the second floating gate is coupled to a voltage source to provide a voltage reference for the pFET M0. A practical reference can be ground itself, as illustrated in FIG. 6B. The pFBT M0 can be omitted altogether, as in FIG. 6C, if a current reference (not shown) is available to the sense amplifier for the current comparison.

In accordance with the embodiments of FIGS. 6A, 6B and 6C, to program a logic "0" in a cell that has a stored logic "1" it is necessary to apply the correct voltages to the terminals V0 and V1 (see, e.g., FIG. 4). Using the convention that there is a logic "0" when I0>I1 the correct voltages are V0=10V and V1=0V (note that, if desired, the convention could be reversed).

For technical reasons (to avoid overstressing the oxide with excess tunneling current) and practical reasons (limitation of the charge pump supplying the high-voltage) the high-voltage applied to program the cell is not held constant but rather is applied with a ramp-like profile. It is possible to perform a timed program operation where the high-voltage is applied for a certain amount of time that is deemed sufficient to tunnel the right amount of charge to and from the floating gates. This can be problematic where transistors are not precisely identical throughout an array or chip as size or conductivity differences may lead one cell to require a longer amount of time to achieve the same state as another cell. Another approach involves applying the high-voltage until a read operation on the memory cell reports that the desired logic value is stored in the cell. This does not pose any technical problems because the time it takes to read the cells is much less than the time it takes to write them. To insure a sufficient write margin a hysteresis mechanism can be introduced to make sure the desired programming window is achieved. Hysteresis can be achieved either by subtracting some current from the winning side (the side that is increasing its intrinsic current, also known as the high current side) or by adding some current to the losing side (the side that is decreasing its intrinsic current, also known as the low current side). This concept is illustrated in FIGS. 7A, 7B, and 7C.

Figure 7A:
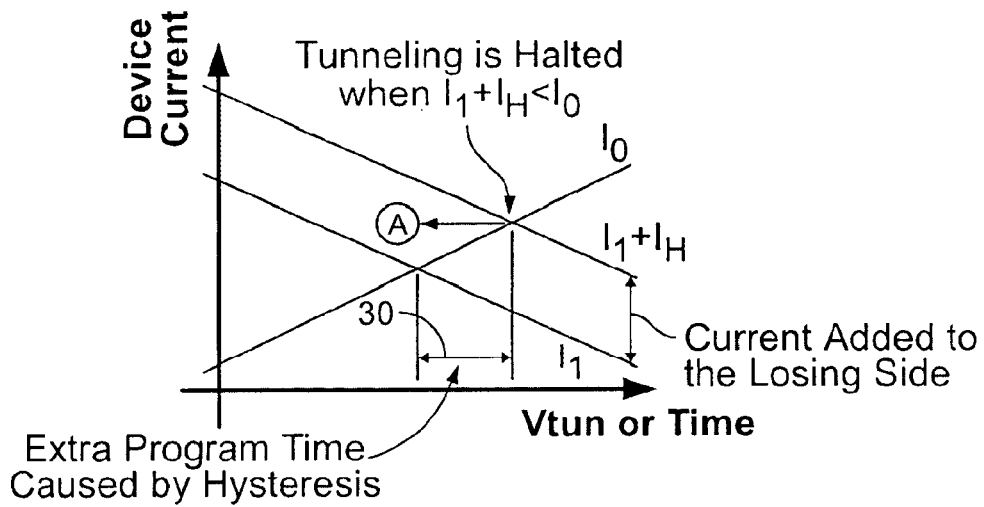
FIG. 7A is a plot of Device readout current vs. Vtun (or, effectively, time) illustrating the concept of hysteresis by addition, in accordance with an embodiment of the present invention. The $I_0/I_1$ curves are the nominal curves. The $I_1+I_H$ curve represents the $I_1$ curve to which hysteresis current $I_H$ has been added. Tunneling is halted when $I_1+I_H<I_0$.
Figure 7B:
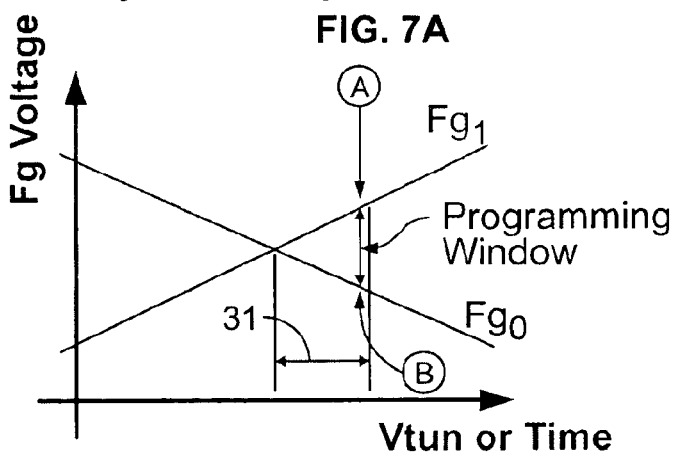
FIG. 7B is a plot of Fg Voltage vs Vtun (or time) for $Fg_0$ and $Fg_1$ illustrating the increase in the size of the programming window as a result of adding the hysteresis current $I_H$.
Figure 7C:
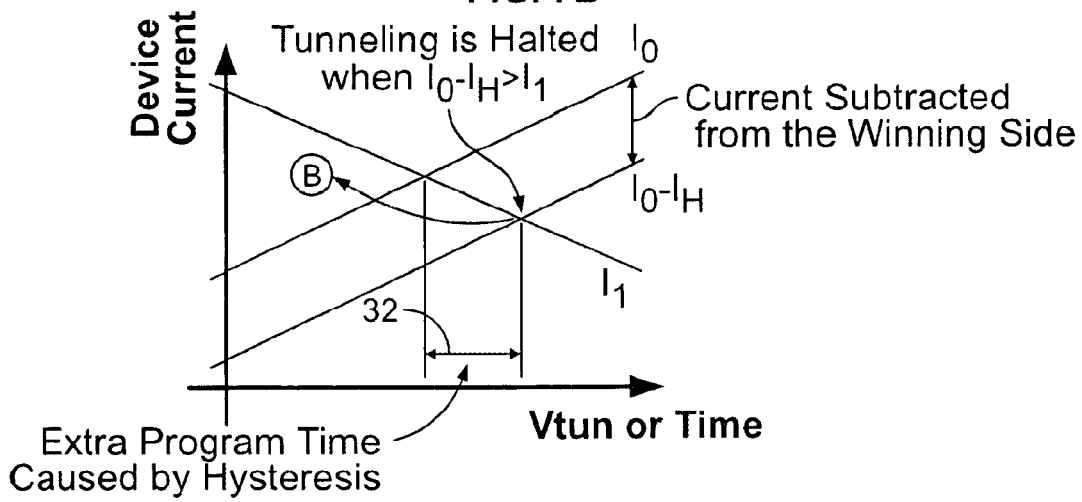
FIG. 7C is a plot of Device current vs. Vtun (or time), illustrating the concept of hysteresis by subtraction. in accordance with an embodiment of the present invention.

FIG. 7A is a plot of Device readout current vs. Vtun (or, effectively, time) and illustrating the concept of hysteresis by addition. The $I_0/I_1$ curves are the nominal curves. The $I_1+I_H$ curve represents the $I_1$ curve to which has been added hysteresis current $I_H$. Tunneling is thus hatted when $I_1+I_H<I_0$. FIG. 7B is a plot of Fg Voltage vs Vtun (or time) for $Fg_0$ and $Fg_1$ illustrating the increase in the size of the programming window as a result of adding the hysteresis current $I_H$. FIG. 7C is a plot of Device current vs. Vtun (pr time) and illustrating the concept of hysteresis by subtraction. The $I_0/I_1$ curves are the nominal curves. The $I_0-I_H$ curve represents the $I_0$ curve from which has been subtracted hysteresis current $I_H$. Tunneling is thus hatted when $I_0-I_H>I_1$. Extra program time to achieve the additional margin is incurred by the hysteresis—shown as 30 in FIG. 7A, 31 in FIG. 7B, and 32 in FIG. 7C.

Figure 8:
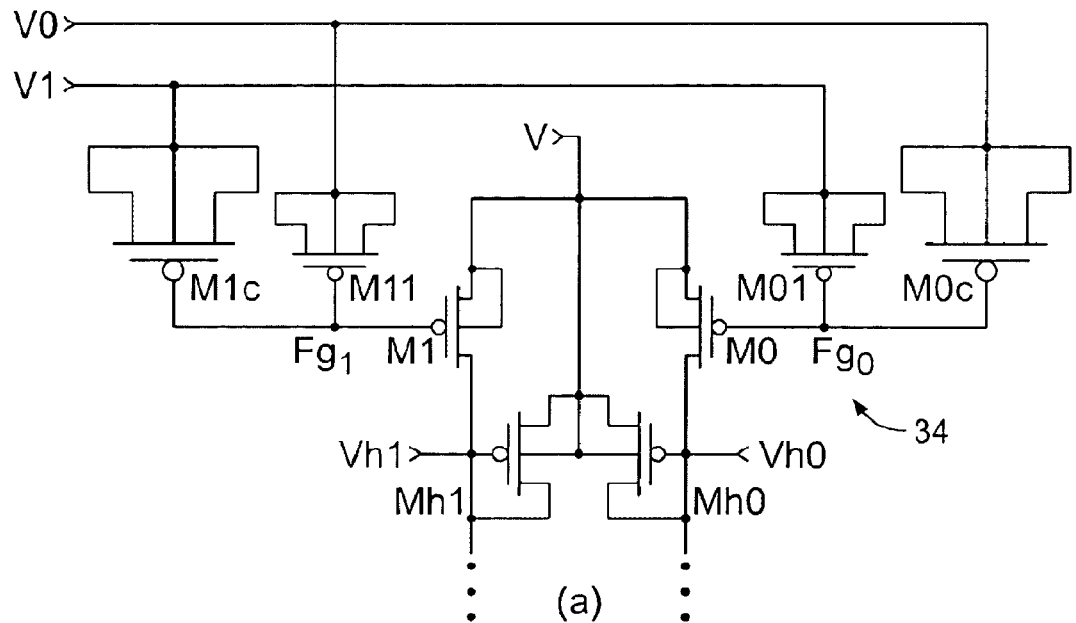
FIG. 8 is an electrical schematic diagram of an NVM cell 34 in accordance with an embodiment of the present invention. The NVM cell 34 utilizes hysteresis by addition and has added pFET transistors Mh1 and Mh0, which have their source and well terminals coupled to V and their drains coupled to the respective current output legs (drains) of the M1 and M0 readout transistors. In this way, the current from Mh1 is added to transistor M1's output current and the current from Mh0 is added to transistor M0's output current. The control signals Vh1 and Vh0 applied, respectively, to the gates of Mh1 and Mh0 control the hysteresis during programming.
Figure 9:
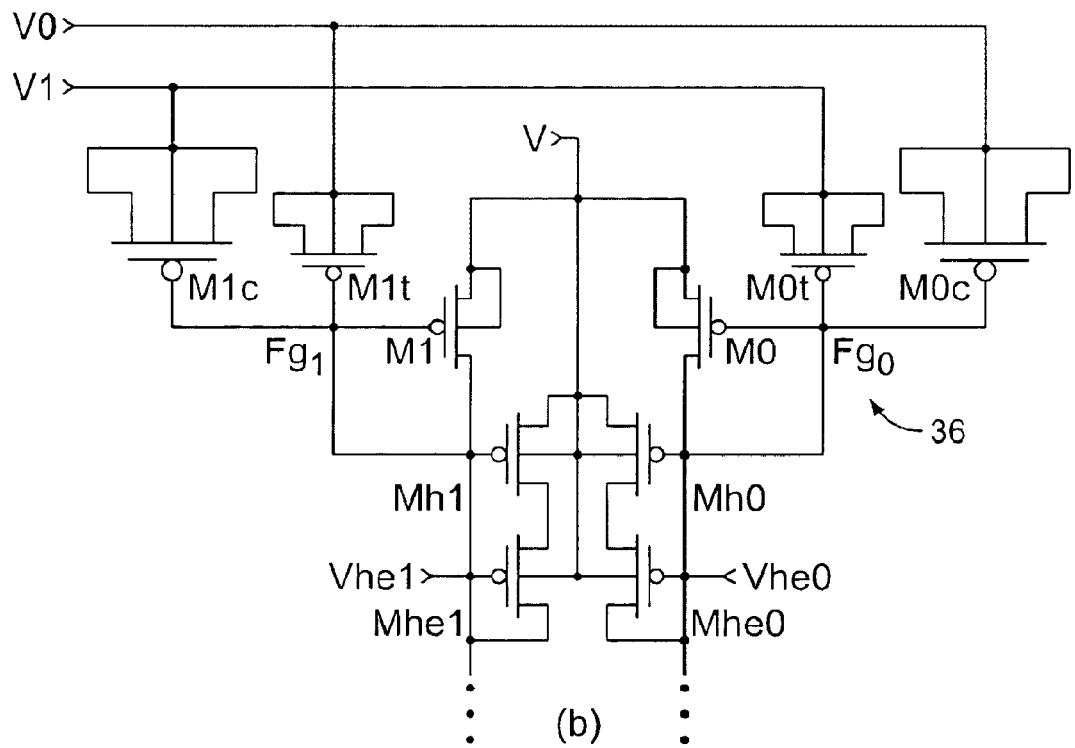
FIG. 9 is an electrical schematic diagram of an NVM cell 36, in accordance with embodiment of the present invention. The NYM cell 36 utilizes hysteresis by addition and has added pFET transistors Mh1, Mhe1, Mh0 and Mhe0. Mh1 and Mh0 have their source and well terminals coupled to V and Mhe1 and Mhe0 have their well terminals coupled to V and their sources coupled to the drains of Mh1 and Mh0, respectively. The drains of Mhe1 and Mhe0 provide the additional hysteresis current during programming. Operation of transistors Mhe1 and Mhe0 is controlled by signals Vhe1 and Vhe0, respectively, applied to their gates.
Figure 10:
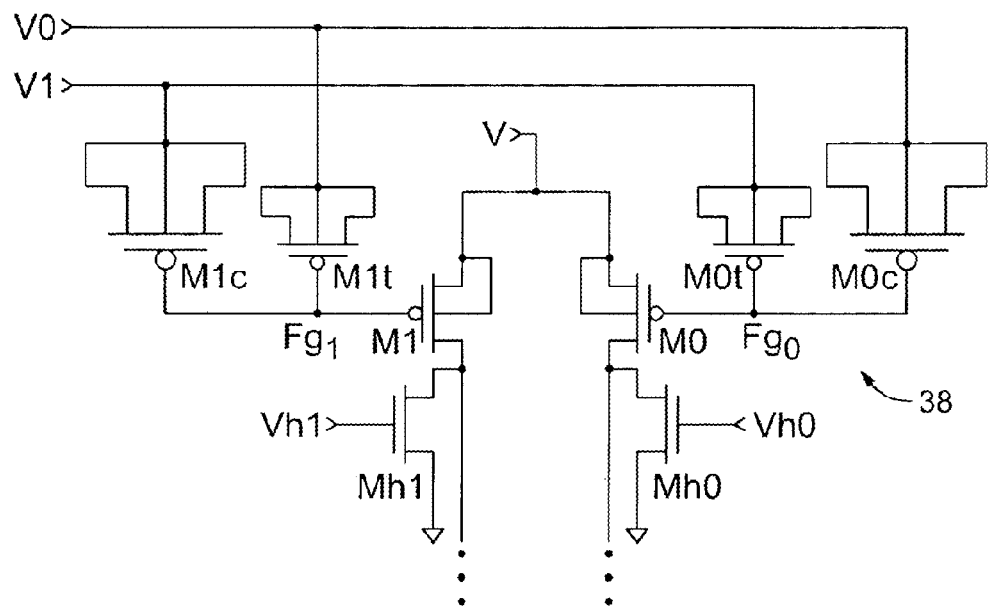
FIG. 10 is an electrical schematic diagram of an NVM cell 38, in accordance with an embodiment of the present invention. The NVM cell 38 utilizes hysteresis by subtraction and has added nFET transistors Mh1 and Mh0 coupled so that their sources are coupled to ground and their drains are in common, respectively, with the drains of M1 and M0, thus subtracting current when they are engaged. Control signals Vh1 and Vh0 applied, respectively, to the gates of Mh1 and Mh0 control the hysteresis function.

In order to implement the hysteresis during programming the basic NVM cell may be modified to include transistors necessary to perform the function. Some examples of such modifications of the basic memory cell are depicted in FIGS. 8, 9 and 10. The FIG. 8 (hysteresis by addition) NVM cell 34 has added pFET transistors Mh1 and Mh0, which have their source and well terminals coupled to V and their drains coupled to the respective current output legs (drains) of the M1 and M0 readout transistors. In this way, the current from Mh1 is added to transistor M1's output current and the current from Mh0 is added to transistor M0's output current. The control signals Vh1 and Vh0 applied, respectively, to the gates of Mh1 and Mh0 control the hysteresis during programming.

The FIG. 9 (hysteresis by addition) NVM cell 36 has added pFET transistors Mh1, Mhe1, Mh0 and Mhe0. Mh1 and Mh0 have their source and well terminals coupled to V and Mhe1 and Mhe0 have their well terminals coupled to V and their sources coupled to the drains of Mh1 and Mh0, respectively. The drains of Mhe1 and Mhe0 provide the additional hysteresis current during programming. Operation of transistors Mhe1 and Mhe0 is controlled by signals Vhe1 and Vhe0, respectively, applied to their gates. Transistors Mh1 and Mh0 in this application have their gates coupled, respectively, to floating gates $Fg_1$ and $Fg_0$ which has the effect of making the hysteresis current proportional to the current of the readout transistor. This approach allows the combined current of the hysteresis transistor and the readout transistor to go to zero and thus guarantees that cell programming can complete. With a fixed hysteresis current, cell programming may not complete if the hysteresis current exceeds the maximum available current from the readout transistor.

The FIG. 10 (hysteresis by subtraction) NVM cell 38 has added nFET transistors Mh1 and Mh0 coupled so that their sources are coupled to ground and their drains are in common, respectively, with the drains of M1 and M0, thus subtracting current when they are engaged. Control signals Vh1 and Vh0 applied, respectively, to the gates of Mh1 and Mh0 control the hysteresis function.

Figure 11A:
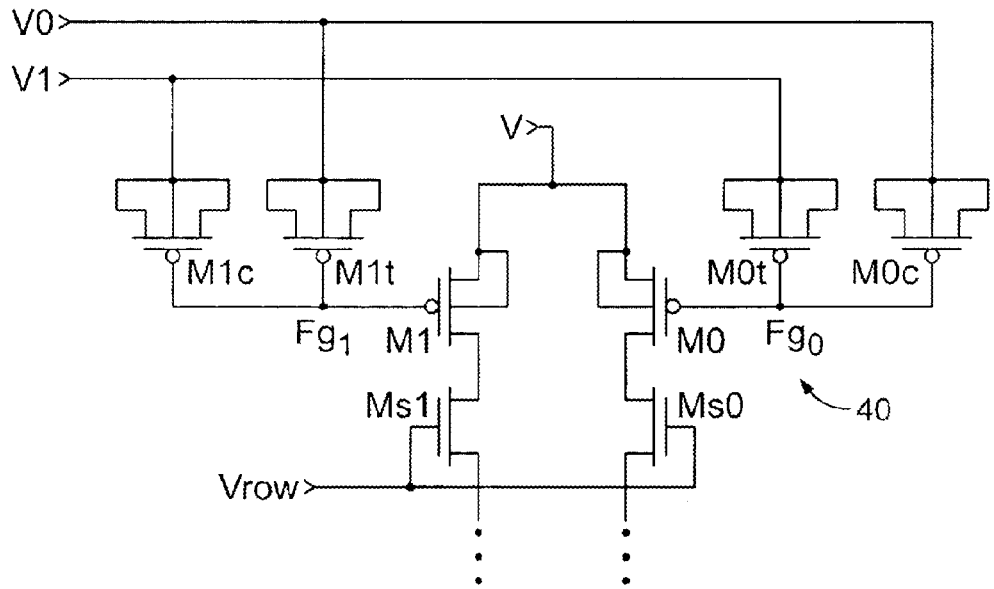
FIG. 11A is an electrical schematic diagram of an NVM cell 40, in accordance with an embodiment of the present invention. The NVM cell 40 includes a pair of nFET readout transistors Ms1 and Ms0 configured as row-select transistors, which control current flow in the drain legs of readout transistors M1 and M0, respectively.
Figure 11B:
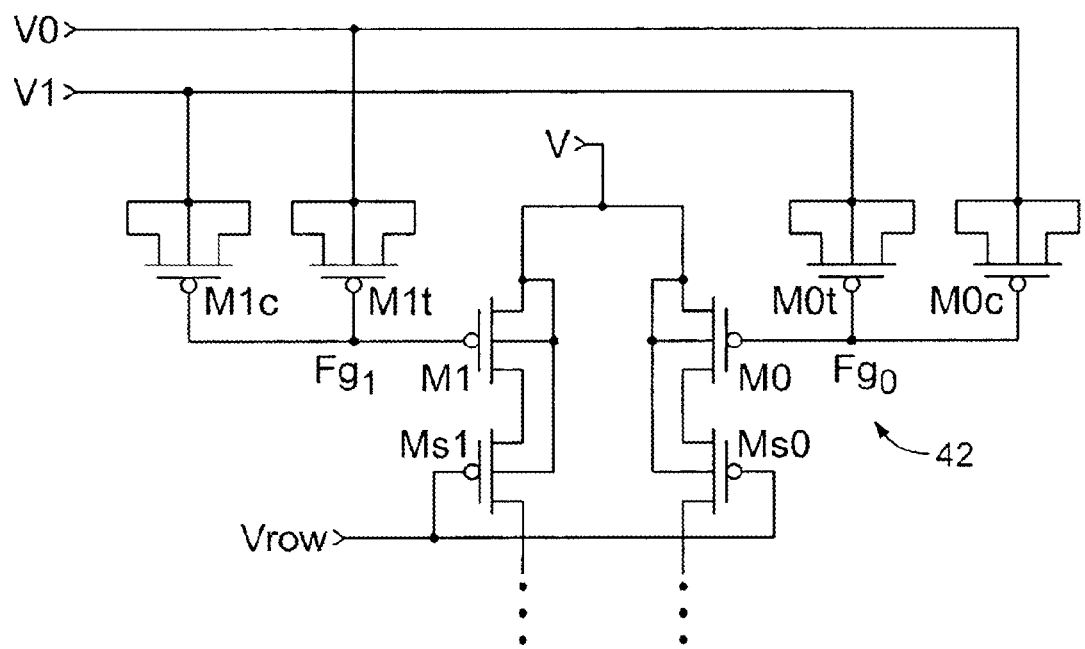
FIG. 11B is an electrical schematic diagram of an NVM cell 42, in accordance with an embodiment of the present invention. The NVM cell 42 includes a pair of pFET readout transistors Ms1 and Ms0 configured as row-select transistors, which control current flow in the drain legs of readout transistors M1 and M0, respectively.

In order to provide an array-type memory disposed in columns and rows as is common in semiconductor memories, it may be desirable to provide readout transistors to control which cells are being read out at a given moment. In NMV circuit 40 of FIG. 11A a pair of nFET readout transistors Ms1 and Ms0 configured as row-select transistors control current flow in the drain legs of readout transistors M1 and M0, respectively. The Vrow signal is coupled to the gates of Ms1 and Ms0 to control whether they conduct or not. Similarly, in NVM circuit 42 of FIG. 11B a pair of pFET readout transistors Ms1 and Ms0 control current flow in the drain legs of readout transistors M1 and M0, respectively. The Vrow signal is coupled to the gates of Ms1 and Ms0 to control whether they conduct or not. These may be used with, or without, the hysteresis transistors discussed above, as desired. Hysteresis current may be added before or after the row select transistors. Hysteresis current added after the row select transistors may be common to all the memory cells in the column. This reduces the total number of devices required and thus reduces memory area.

Figure 12:
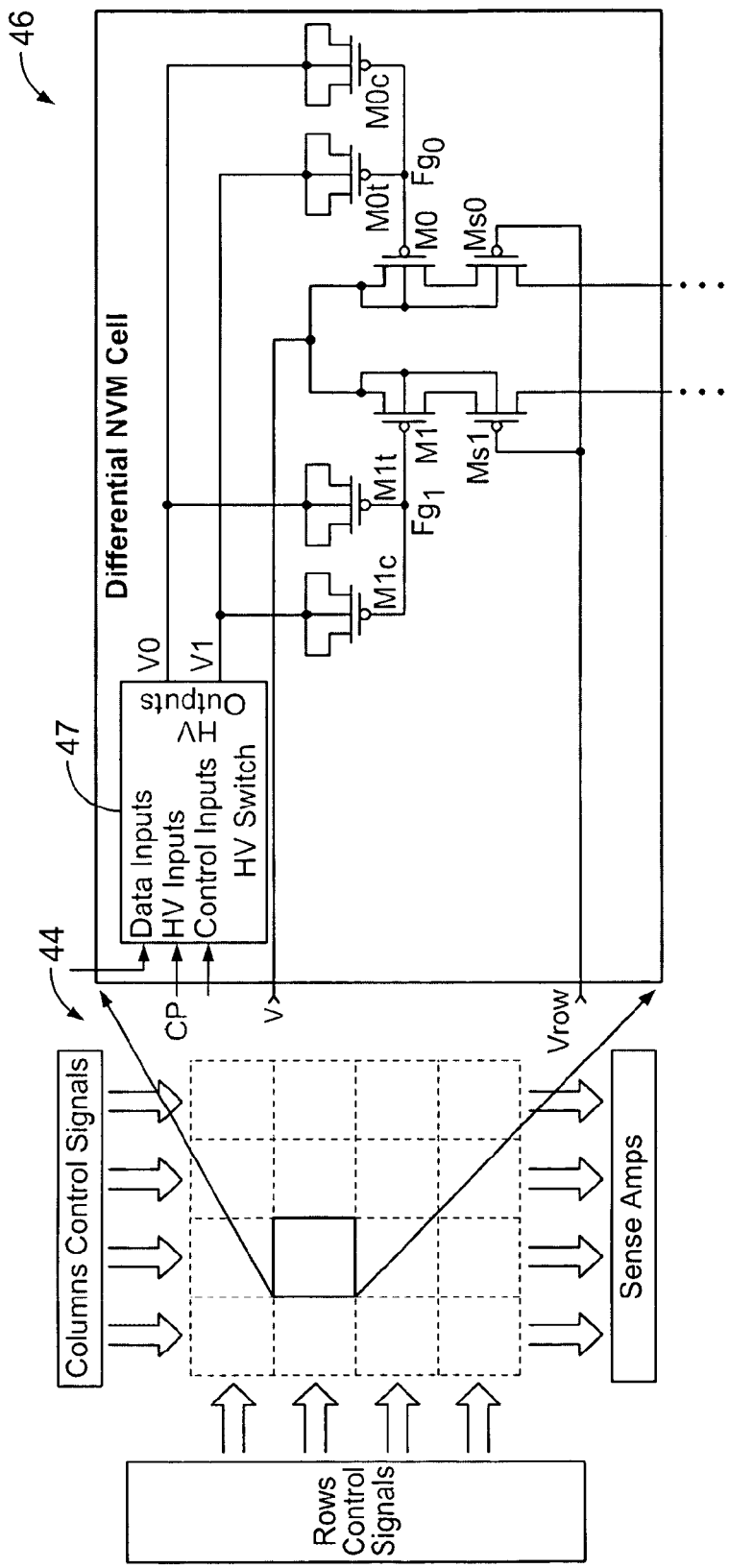
FIG. 12 is a block diagram of an array of NVM cells and an electrical schematic diagram of one of those cells, in accordance with an embodiment of the present invention.

Once the row-select transistors are embedded in the non-volatile memory cells, it is possible to array the cells in a row-column configuration like the one depicted in FIG. 12. A drawback of this approach is that every nonvolatile memory cell will be required to contain a high-voltage switch (typically a high-voltage nFET with its drain disposed in an n+ region such as an LDMOS (lateral defused MOS) or a DEMOS (drain extended MOS) cascoded with another nFET so that it can handle the relatively high voltages used for writing the NVM cells without breaking down) to provide the appropriate data-dependent voltages to the V0 and V1 terminals of the memory cell during programming.

In the array 44 of NVM cells 46 depicted in FIG. 12, column control signals comprise the data inputs referred to as D1 and D0 for the cell; row control signals comprise the row select signals and any hysteresis control signals which may be used as well as the high-voltage power for the high-voltage switch for each NVM cell. Other control signals may be also used, depending on the particular implementation, such as the choice of switch, etc. V may be applied via the row control signals to each NVM cell or it may be provided in some other way such as with the column control signals. Sense amplifiers are arranged for each column to receive the drain current from M1 and M0 for the selected row.

In this embodiment, a high-voltage switch has to be included in every cell location in order to prevent program-disturb—changing an already-programmed cell's contents while writing a different cell. In order to overcome this drawback and make a more space-efficient NVM cell, the basic NVM cell may be reconfigured to that, shown in FIG. 13A. The FIG. 13A drawing shows the tunneling transistors as capacitors, denoted TJ1 and TJ0 and the control transistors as capacitors, denoted C1 and C0 for clarity, but they may be implemented with the pFETs as illustrated, for example, in FIGS. 1 and 2, discussed above. In this embodiment, VDD is provided at all times to bias the gates of transistors M1$d$ and M0$d$; REN (row enable); TUN and RSB (row select bar) are provided as shown in the table of FIG. 14A. The signals VDD, REN, TUN and RSB are the row control signals, although VDD need not be applied via a row and could instead be applied via a column. The column control signals comprise the data signals on lines D1 and D0 and these are applied as illustrated, for example, in the table of FIG. 14A. Other values may also be possible.

The NVM cell circuit 48 of FIG. 13A differs from the NVM cell circuit 46 of FIG. 12, in that in addition to the removal of the high-voltage switch 47 from the NVM cell 46 (because the high-voltage switching can be handled once per line, per row or column), two additional pFETs M1$d$ and M0$d$ have been added. M1$d$ and M0$d$ have their gates coupled together and to VDD and their sources, drains and well connections coupled to the corresponding sources, drains and well connections of respective readout transistors M1 and M0. This is done in order to avoid disturbing the contents of the cell when it is not selected. As can be see from the table in FIG. 14A, during read operations, the REN (row enable) line is set to VDD and with the gates of M1$d$ and M0$d$ at VDD M1$d$ and M0$d$ are not conducting and readout transistors M1 and M0 operate normally to provide an output current as a function of charge stored on corresponding floating gates $Fg_1$ and $Fg_0$. During a write operation for a different cell in the same column, REN is set to approximately half the tunneling voltage. With VDD on the gates of M1$d$ and M0$d$, M1$d$ and M0$d$ conduct, effectively connecting the drain nodes of M1 and M0 to REN. Since the drain, source and bulk nodes of both M1 and M0 are set to half the tunneling voltage, there can be no tunneling across M1 or M0. And since TUN is also set to half the tunneling voltage during this write protect mode, there can be no tunneling across TJ1 or TJ0.

To make a more space-efficient NVM cell, the prior art. NVM cell is reconfigured to that shown in FIG. 13B. The FIG. 13B drawing shows the tunneling transistors as capacitors denoted TJ1 and TJ0 and the control transistors as capacitors denoted C1 and C0 for clarity but they may be implemented with the pFETs as illustrated, for example, in FIGS. 1 and 2, discussed above. In this embodiment, REN (row enable); TUN and RSB (row select bar) are provided as shown in the table of FIG. 14B. The signals REN, TUN and RSB are the row control signals The column control signals comprise the data signals on lines D1 and D0 and these are applied as illustrated, for example, in the table of FIG. 14B. Other values may also be possible.

Note the absence transistors M0$d$ and M1$d$, shown in FIG. 13A, and in FIG. 13 of issued U.S. Pat. No. 7,221,596B2. The inventors has since found that removal of these transistors has no effect of the basic operation of the NVM cell, nor does it have any detrimental effect on the program-disturb characteristic of the cell. To protect against program-disturb the behaviors of nodes N0 and N1 are important factors to be considered. Behaviors of this node are discussed next.

Figure 19:
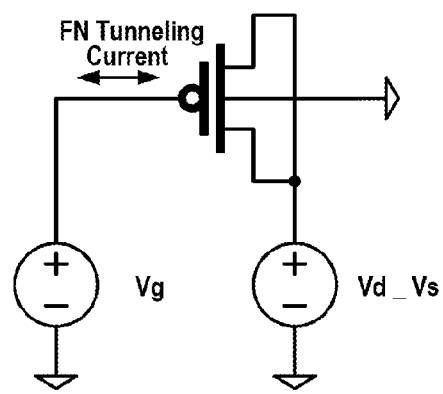
FIG. 19 is a simplified circuit diagram showing a FN tunneling current of the NVM cell.
Figure 20:
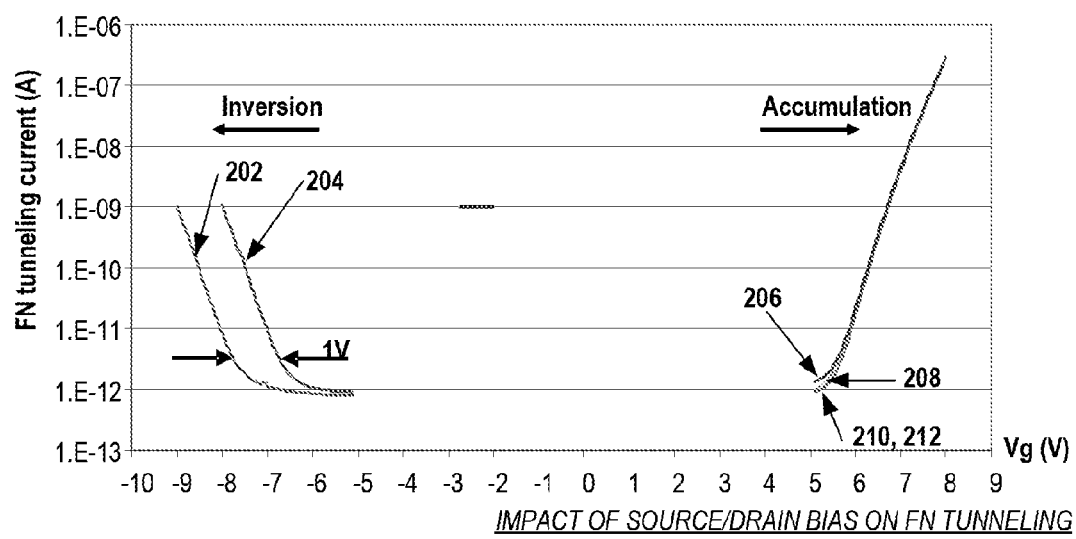
FIG. 20 is a diagram showing the impact of source/drain bias on the FN tunneling current the NVM cell of FIG. 19.

In FIG. 19, the FN tunneling currents of transistors M0 and M1 are shown. In FIG. 20 the diagram shows the impact of source/drain bias on the FN tunneling currents. Where traces 206, 208, 210, and 212 show accumulation tunneling currents at Vd_Vs (N1) equals −3V, −2V, −1V, and 0V respectively. The diagram shows that EN tunneling current to transistor M1 is independent of N1. Therefore holding it at a particular value, for example 5V is not necessary to protect against program disturb. Traces 202 and 204 show the inversion tunneling currents at Vd_Vs (N0) equals −1V and 0V respectively. Although inversion tunneling currents show dependency of Vd-Vs, this dependency does not play any role in program disturb since node N0 is held at REN by transistor M0.

Figure 15:
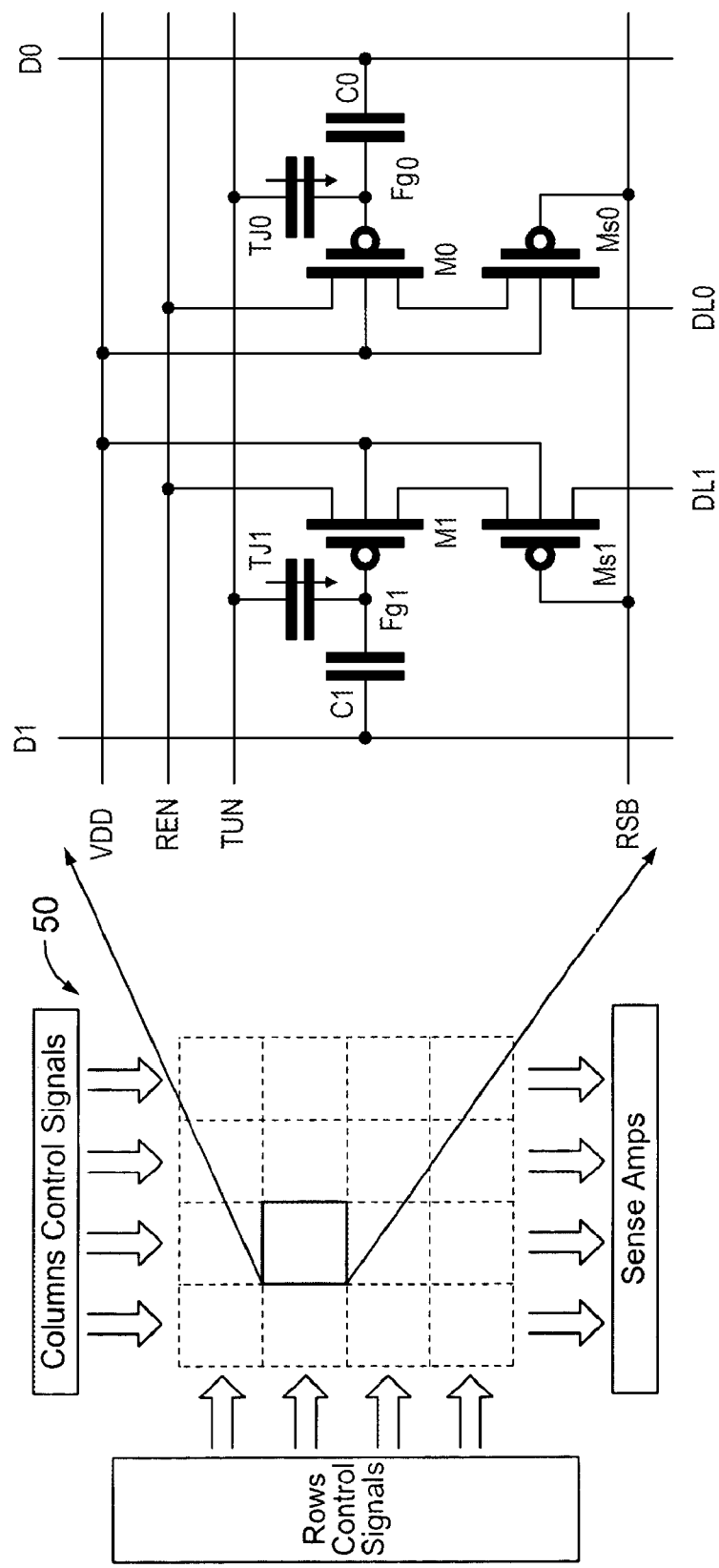
FIG. 15 is a block diagram of an array of NVM cells, in accordance with FIG. 13B, and an electrical schematic diagram of one of those cells, in accordance with an embodiment of the present invention.

Turning now to FIG. 15, an array 50 of NVM cells 48 is depicted which operates in accordance with the voltages stated in the table of FIG. 14B. Smaller minimum feature sizes and reduced oxide thickness may reduce these voltage requirements somewhat. In this array 50 the TUN, REN and RSB signals are common for a given row and comprise the row control signals while D1 and D0 are common for a given column and comprise the column control signals. Sense amplifiers (or equivalent readout circuitry) is provided for each column and reads the output currents for the selected row.

Figure 16:
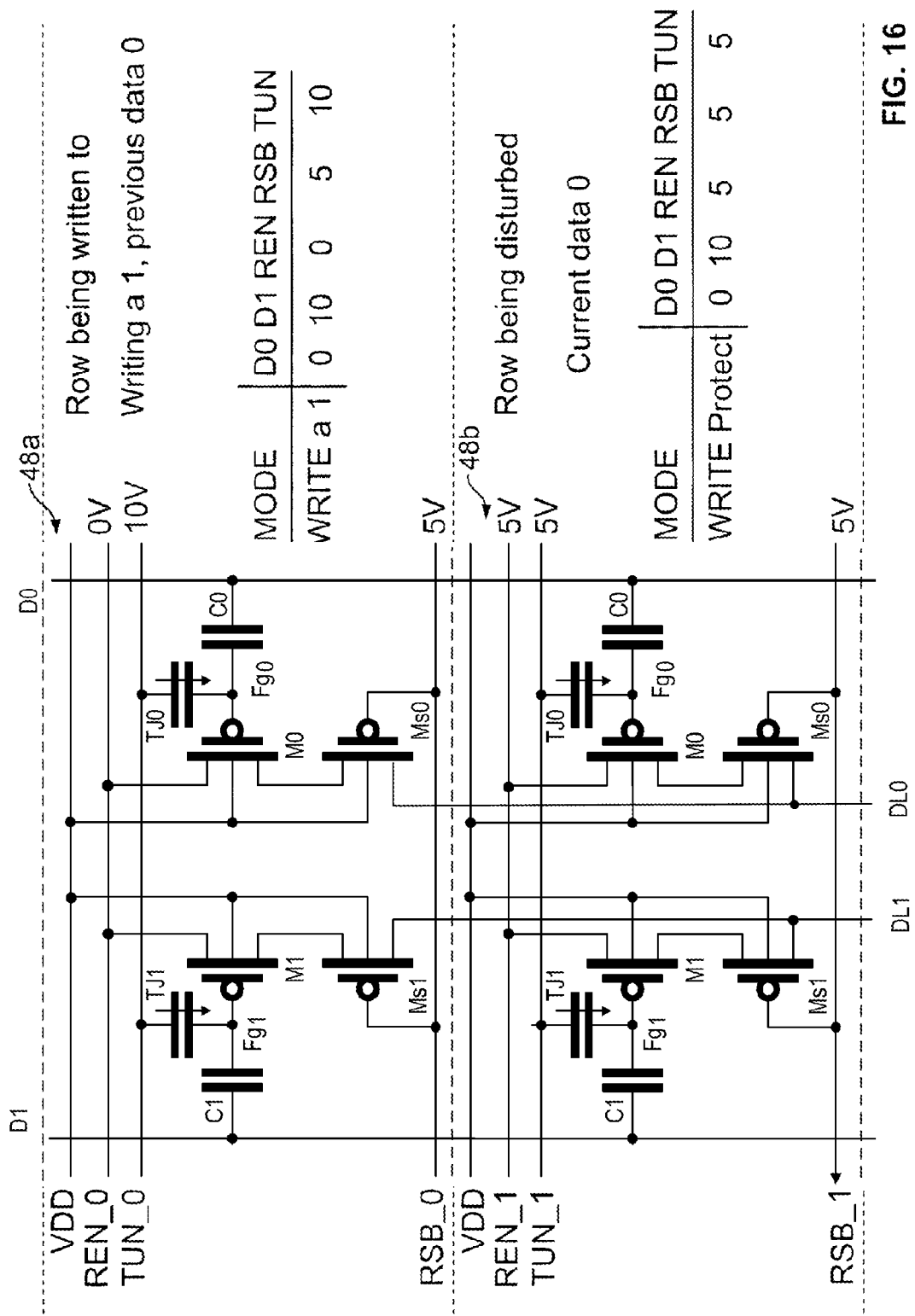
FIG. 16 is an electrical schematic diagram illustrating how the present invention avoids program disturb in respect to two adjacent NVM cells within the same column.

FIG. 16 illustrates how the present invention avoids program disturb with respect to two adjacent NVM cells 48$a$ and 48$b$ within the same column. Cell 48$a$ is having a 1 written where the previously stored data was a zero (as after the cell was erased, for example). In this case, using the figures from the table in FIG. 14B, D0=0V, D1=10V, REN_0 (for this row)=0V, RSB_0 (for this row)=5V and TUN_0 (for this row)=10V. In the adjacent cell 48$b$, to avoid disturbing already-stored data, D0=0V and D1=10V because these are in common with NVM cell 48$a$. REN_1=RSB_1=TUN_1=5V. This prevents disturb and also keeps any current from M1 and M0 of NVM cell 48$b$ from contributing to the output current.

FIG. 17 is an electrical schematic diagram of an NVM cell for use in an array of NVM cells in accordance with another embodiment of the present invention. The difference between the cell of FIG. 17 and the cell of FIG. 13B is that the well of at least some of the FET devices is not controlled directly by signal REN, but from a different signal (WELL) in the FIG. 17 embodiment. This permits more freedom in the choice of biasing condition during various states of operation. In the embodiment of FIG. 17, the TUN, R EN and RSB signals are common for a given row of an array of like memory cells; the D1 and D0 signals are common for a given column of like memory cells and the WELL signal can be shared by all like memory cells in the array.

FIG. 18 is a table illustrating a set of applied voltages and operating states for the NVM cell of FIG. 17. Those of ordinary skill in the art will now realize that other values may also work.

A method of operating the cells described herein includes applying the voltage signals set forth in exemplar FIGS. 14B and 18 to the corresponding cells of FIGS. 13B and 17, respectively. The voltages are typically developed on chip using charge pumps for minimum size. Charge pumps may provide static voltages, or, more effectively, ramped voltages as are well known to those of ordinary skill in the art. In accordance with the claims set forth below, the "biasing" may be achieved with the control capacitor structure. The "charging" and "discharging" may be achieved with the tunneling capacitor structure to achieve Fowler-Nordheim tunneling. Note that the voltages set forth in FIGS. 14B and 18 are exemplary voltages for use with devices built in a 0.18 micron minimum feature size logic CMOS fabrication process technology. As technology improves, minimum feature sizes steadily decrease until some possible fundamental physical limit is ultimately reached. As these sizes decrease, the voltages used will also decrease as the same electric field can be achieved with a smaller voltage over a correspondingly smaller distance. Thus, the voltages set forth in FIGS. 14B and 18 are examples only and those of ordinary skill in the art will now realize that other voltages may be used where appropriate for the process technology used to fabricate the memory cells.

While embodiments and applications of this invention have been shown and described, it will now be apparent to those skilled in the art having the benefit of this disclosure that many more modifications than mentioned above are possible without departing from the inventive concepts disclosed herein. Therefore, the appended claims are intended to encompass within their scope all such modifications as are within the true spirit and scope of this invention

What is claimed is:

1. A nonvolatile memory array comprising:
    one or more columns of memory cells, each memory cell comprising:
        a first transistor having a first source terminal coupled to a row enable signal line and a first floating gate;
        a second transistor having a second source terminal coupled to the row enable signal line and a second floating gate;
        a first control capacitor coupled between a first data line and the first floating gate;
        a first tunneling capacitor coupled between a tunneling signal line and the first floating gate;
        a second control capacitor coupled between a second data line and the second floating gate;
        a second tunneling capacitor coupled between the tunneling single line and the second floating gate;
        a first readout switch having a first readout terminal and a first terminal coupled to a drain terminal of the first transistor, wherein a first current at the first readout terminal is substantially equal to drain current of the first transistor when the first readout switch is turned on; and
        a second readout switch having a second readout terminal and a second terminal coupled to a drain terminal of the second transistor, wherein a second current at the second readout terminal is substantially equal to drain current of the second transistor when the second readout switch is turned on; and
    a hysteresis circuit having a first node and a second node, the first node coupled to the first readout terminal, the second node coupled to the second readout terminal, the hysteresis circuit configured to modify a duration over which one or more memory cells in a column are programmed by increasing or decreasing current at one of the first and the second readout terminals.

2. The nonvolatile memory array of claim 1, wherein current at one of the readout terminals is increased or decreased responsive to receiving a control signal at a hysteresis control node of the hysteresis circuit.

3. The nonvolatile memory array of claim 2, the hysteresis circuit comprising:
    a first pFET hysteresis transistor having:
        a gate terminal configured as a first hysteresis control node,
        a source terminal coupled to the row enable signal line, and
        a drain terminal coupled to the first node; and
    a second pFET hysteresis transistor having:
        a gate terminal configured as a second hysteresis control node,
        a source terminal coupled to the row enable signal line, and
        a drain terminal coupled to the second node.

4. The nonvolatile memory array of claim 3, wherein providing a row enable signal and hysteresis control signal to one of the hysteresis transistors causes the same hysteresis transistor to supply a hysteresis current at the first or second node.

5. The nonvolatile memory array of claim 2, the hysteresis circuit comprising:
    a first nFET hysteresis transistor having:
        a gate terminal configured as a first hysteresis control node,
        a source terminal coupled to ground, and
        a drain terminal coupled to the first node; and
    a second nFET hysteresis transistor having:
        a gate terminal configured as a second hysteresis control node,
        a source terminal coupled to ground, and
        a drain terminal coupled to the second node.

6. The nonvolatile memory array of claim 5, wherein providing a hysteresis control signal to one of the hysteresis transistors causes the same hysteresis transistor to receive a hysteresis current via the first or second node.

7. The nonvolatile memory array of claim 6, wherein a hysteresis current received via the first node comprises a portion of the first current and a hysteresis current received via the second node comprises a portion of the second current.

8. The nonvolatile memory array of claim 1, wherein the first and the second readout switches are turned on responsive to receiving a row select signal.

9. The nonvolatile memory array of claim 1, wherein the first and the second transistors are P-channel Field Effect Transistor (pFET).

10. The nonvolatile memory array of claim 1, wherein each memory cell does not include a third transistor having a drain terminal connected to the drain terminal of the first transistor or a fourth transistor having a drain terminal connected to the drain terminal of the second transistor.

11. A method of controlling programming of memory cells, the method comprising:
    generating drain current at a first transistor responsive to receiving charge at a first floating gate of the first transistor;
    receiving the drain current of the first transistor at a first terminal of a first readout switch;
    generating a first readout current at a second terminal of the first readout switch responsive to turning on of the first readout switch, wherein the first readout current is substantially equal to drain current of the first transistor;
    generating drain current at a second transistor responsive to receiving charge at a second floating gate of the second transistor;
    receiving the drain current of the second transistor at a first terminal of a second readout switch;
    generating a second readout current at a second terminal of the second readout switch responsive to turning on of the second readout switch, wherein the second readout current is substantially equal to drain current of the second transistor; and modifying a duration over which one or more memory cells in a column are programmed by increasing or decreasing the first readout current at a first node or the second readout current at a second node by a hysteresis current.

12. The method of claim 11, wherein the first floating gate and the second floating gate receive charge responsive to tunneling voltage signals sufficient to cause Fowler-Nordheim tunneling across a dielectric insulating the first or second floating gate.

13. The method of claim 12, further comprising halting application of one or more tunneling voltage signals during a cell programming sequence responsive to comparing current at the first and second node, the comparison indicating whether the cell programming sequence is complete.

14. The method of claim 13, wherein the programming sequence is complete if, subsequent to the increase or decrease in the first readout current or the second readout current by the hysteresis current responsive to a hysteresis control signal, the current at the first readout node is substantially equal to the current at the second readout node.

15. The method of claim 11, wherein the first and second transistors are P-channel Field Effect Transistors (pFETs).

16. The method of claim 11, wherein each memory cell does not include a third transistor having a drain terminal connected to the drain terminal of the first transistor or a fourth transistor having a drain terminal connected to the drain terminal of the second transistor.

17. The method of claim 11, wherein a hysteresis circuit for generating hysteresis current comprises:
a first pFET hysteresis transistor having:
a gate terminal configured as a first hysteresis control node,
a source terminal coupled to a row enable signal line, and
a drain terminal coupled to the first node; and
a second pFET hysteresis transistor having:
a gate terminal configured as a second hysteresis control node,
a source terminal coupled to the row enable signal line, and
a drain terminal coupled to the second node.

18. The method of claim 17, wherein providing a row enable signal and hysteresis control signal to one of the hysteresis transistors causes the same hysteresis transistor to supply a hysteresis current at the first or second node.

19. The method of claim 11, wherein a hysteresis circuit for generating hysteresis current:
a first nFET hysteresis transistor having:
a gate terminal configured as a first hysteresis control node,
a source terminal coupled to ground, and
a drain terminal coupled to the first node; and
a second nFET hysteresis transistor having:
a gate terminal configured as a second hysteresis control node,
a source terminal coupled to ground, and
a drain terminal coupled to the second node.

20. The method of claim 19, wherein providing a hysteresis control signal to one of the hysteresis transistors causes the same hysteresis transistor to receive a hysteresis current via the first or second node.

21. The method claim 20, wherein a hysteresis current received via the first node comprises a portion of the first readout current and a hysteresis current received via the second node comprises a portion of the second readout current.

22. An apparatus comprising:
one or more columns of memory cells, each memory cell comprising:
a first transistor having a first source terminal coupled to a row enable signal line and a first floating gate;
a second transistor having a second source terminal coupled to the row enable signal line and a second floating gate;
a first control capacitor coupled between a first data line and the first floating gate;
a first tunneling capacitor coupled between a tunneling signal line and the first floating gate;
a second control capacitor coupled between a second data line and the second floating gate;
a second tunneling capacitor coupled between the tunneling single line and the second floating gate;
a first readout switch having a first readout terminal and a first terminal coupled to a drain terminal of the first transistor, wherein a first current at the first readout terminal is substantially equal to drain current of the first transistor when the first readout switch is turned on; and
a second readout switch having a second readout terminal and a second terminal coupled to a drain terminal of the second transistor, wherein a second current at the second readout terminal is substantially equal to drain current of the second transistor when the second readout switch is turned on; and
a hysteresis circuit having a first node and a second node, the first node coupled to the first readout terminal, the second node coupled to the second readout terminal, the hysteresis circuit configured to modify a duration over which one or more memory cells in a column are programmed by increasing or decreasing current at one of the first and the second readout terminals.

23. The apparatus of claim 22, wherein each memory cell does not include a third transistor having a drain terminal connected to the drain terminal of the first transistor or a fourth transistor having a drain terminal connected to the drain terminal of the second transistor.

24. The apparatus of claim 22, wherein current at one of the readout terminals is increased or decreased responsive to receiving a control signal at a hysteresis control node of the hysteresis circuit.

25. The apparatus of claim 24, the hysteresis circuit comprising:
a first pFET hysteresis transistor having:
a gate terminal configured as a first hysteresis control node,
a source terminal coupled to the row enable signal line, and
a drain terminal coupled to the first node; and
a second pFET hysteresis transistor having:
a gate terminal configured as a second hysteresis control node,
a source terminal coupled to the row enable signal line, and
a drain terminal coupled to the second node.

26. The apparatus of claim 24, the hysteresis circuit comprising:
a first nFET hysteresis transistor having:
a gate terminal configured as a first hysteresis control node,
a source terminal coupled to ground, and
a drain terminal coupled to the first node; and
a second nFET hysteresis transistor having:

a gate terminal configured as a second hysteresis control node, a source terminal coupled to ground, and a drain terminal coupled to the second node.

27. The apparatus of claim 22, wherein the first and the second readout switches are turned on responsive to receiving a row select signal.

* * * * *